United States Patent [19]

Chopra

[11] 3,740,668

[45] June 19, 1973

[54] VARIABLE DUTY-CYCLE AND FREQUENCY OSCILLATOR CIRCUIT

[75] Inventor: Jagdish C. Chopra, Inglewood, Calif.

[73] Assignee: TRW Inc., Los Angeles, Calif.

[22] Filed: Sept. 20, 1971

[21] Appl. No.: 182,062

[52] U.S. Cl. ............................... 331/113 R, 332/14

[51] Int. Cl. ........................................... H03k 3/282

[58] Field of Search ........................ 331/113; 332/14

[56] References Cited

UNITED STATES PATENTS 3,253,186 5/1966 Rogers et al. ........................ 331/113

FOREIGN PATENTS OR APPLICATIONS 1,429,616 1/1966 France ............................... 331/113

*Primary Examiner*—John Kominski

*Attorney*—Spensley, Horn & Lubitz

[57] ABSTRACT

An oscillator circuit having a variable duty-cycle and frequency, both of which are determined by the amplitude of an input analog signal. The output of the invented circuit is a waveform having a fixed off-time and a variable on-time, the latter being inversely proportional to the amplitude of the input signal voltage level. The significant characteristic of the output waveform is that in each cycle the product of (i) the output voltage and (ii) the on-time is substantially constant. This output characteristic of the present invention makes it useful in a number of applications, one of which is as a voltage regulator. The invented circuit comprises, in part, (i) a pair of switches, typically transistors, which cyclically and alternately switch on and off, and (ii) a pair of charging capacitors which cyclically and alternately control the switching times of the switches. The fixed time constant with which one of the two charging capacitors is charged determines the fixed off-time of the circuit's output waveform, while the variable charging rate of the second capacitor, a rate which is proportional to the input signal voltage, determines the variable on-time of the output waveform.

1 Claim, 3 Drawing Figures

JAGDISH C. CHOPRA
INVENTOR

BY Spensley, Horn & Lubitz
ATTORNEYS

VARIABLE DUTY-CYCLE AND FREQUENCY OSCILLATOR CIRCUIT

BACKGROUND OF THE INVENTION

1. Field of the Invention

This invention relates to the field of electronic frequency oscillator circuits, and, more particularly, to a variable duty-cycle and frequency oscillator whose duty-cycle and frequency are each a function of the amplitude of an input analog signal.

2. Prior Art

Electronic oscillator circuits whose duty-cycles and frequencies vary as a function of the circuit's input voltage level, have been disclosed in the prior art. Although these circuits are functionally similar to the invented circuit, there are significant differences between them and that of the present invention. Firstly, the circuits disclosed in the prior art have typically required the utilization of magnetic components, such as transformers or saturable reactors, in order to provide the desired function. Since such magnetic components are relatively large and bulky, these circuits have not been amenable to microminiaturization. Secondly, the circuits disclosed by the prior art have also typically required a relatively large number of components. This factor has increased their cost and further reduced their usability in microelectronic applications. In recent years the number of microelectronic applications which require oscillators having the characteristics of the invented circuit have increased, particularly in the area of computer power supplies and laser power supplies. Thus, it has become apparent that the circuits disclosed in the prior art are inherently incapable of fulfilling the requirements for microelectronic circuitry in these applications. The present invention, on the other hand, discloses an oscillator circuit which can provide the desired function without the use of any of the magnetic components relied upon in the past. The invented circuit, therefore, is amenable to fabrication by microelectronic techniques and, as a result, it can satisfy the microminiaturization requirements imposed in many applications. A further advantage of the present invention over the prior art is that it produces the desired function with a minimum of components, thereby achieving an economic benefit as well as further miniaturization.

BRIEF SUMMARY OF THE INVENTION

The present invention is comprised, in part, of (i) two switches, preferably transistors, which cyclically and alternately switch from a fully conducting state to a fully non-conducting state, and (ii) a pair of charging capacitors. With reference to embodiments of the present invention using transistors as switches, the plates of the first charging capacitor are connected to the collector of the first switching transistor and to the base of the second switching transistor respectively, while the plates of the second charging capacitor are connected to the collector of the second switching transistor and to the base of the first switching transistor respectively. (Hereinafter the plates of the charging capacitors which are connected to the collectors of their respective switching transistors will be referred to as the "collector sides," while the sides of the charging capacitors which are connected to the bases of their respective switching transistors will be referred to as the "base sides"). The emitters of each of the switching transistors are connected to the circuit's ground.

During a first phase of each cycle, the first charging caacitor is charged through a first path defined by a charging resistor and the first switching transistor, the latter being in its fully conducting state. The charging rate is determined by the fixed RC time constant of the path; i.e., by the product of the resistance and capacitance of the path. During a second phase of each cycle, the second charging capacitor is charged through a second path defined by at least one transistor acting as a current source, and the second switching transistor, the latter being in its fully conducting state. As explained more fully hereinbelow, the charging rate of the second charging capacitor is directly proportional to the amplitude of the input signal.

The operation of the invention circuit is basically as follows: During the first phase of each cycle, the first switching transistor is in its fully conducting state, thereby providing an electrical path through which the first charging capacitor is charged (with a fixed time constant, as indicated above). During this phase, the base side of the first charging capacitor charges toward $+V_1$ volts, where $V_1$ volts is a substantially constant power supply voltage. The voltage on the base side of the first charging capacitor determines whether the second switching transistor is in its conducting or non-conducting state. Thus, until the voltage on the base side of the first charging capacitor reaches the base-to-emitter voltage of the second switching transistor, $V_{BE_2}$, the latter is negatively biased to be in a non-conducting state.

At the instant the voltage on the base side of the first charging capacitor reaches $V_{BE_2}$, the second switching transistor is turned on, causing the voltage on the base side of the second charging capacitor to drop instantly to $-V_1$ volts. This negative voltage acts to bias off the first switching transistor. Thus, at this instant the first phase of the cycle ends and the second phase commences.

During the second phase of each cycle, the base side of the second charging capacitor charges toward $+V_1$ volts. The voltage on the base side of the second charging capacitor detemines whether the first switching transistor is in its conducting or non-conducting state. Thus, until the voltage on the base side of the second charging capacitor reaches a voltage equal to the base-to-emitter voltage of the first switching transistor, $V_{BE_1}$, the first switching transistor is negatively biased to be in a non-conducting state. This is a mirror image of what takes place during the first phase of the cycle, except for the following significant difference, to wit: the second charging capacitor is charged by a current which is directly proportional to the input signal voltage. Thus, unlike the first charging capacitor, the second charging capacitor is not charged at an exponential rate determined by a fixed time constant, but, instead, by a variable current. As the input signal voltage increases, the charging current increases; consequently, less time is required for the base side of the second charging capacitor to reach $V_{BE_2}$, volts. Conversely, as the input signal voltage decreases, the charging current decreases, requiring more time for the second charging capacitor to reach $V_{BE_1}$, volts.

At the instant the voltage on the base side of the second charging capacitor reaches $V_{BE_1}$, the first switching transistor is turned on, causing the voltage on the base side of the first charging capacitor to drop instantly to $-V_1$ volts. This negative voltage acts to bias off the second switching transistor. Thus, at this instant, the second phase of the present cycle ends, and the next cycle begins.

A gating signal is taken from the collector of the first switching transistor and connected to an output switch, typically a transistor. With reference to embodiments of this invention which utilize a transistor as the output switch, the gating signal is connected to the base of the output transistor and the circuit's input signal is connected to the collector. The emitter of the output transistor is connected to the output terminal of the invented circuit. The gating signal determines the conducting or non-conducting state of the output transistor. Thus, the output of the invented circuit is the product of the input signal and the operating function of the output transistor. During the first phase of each cycle, the output transistor is in a non-conducting state, and no voltage appears at the output of the circuit. During the second phase of the cycle, the gating signal causes the output transistor to conduct for a variable time interval which is inversely proportional to the input signal amplitude. Thus, for the duration of the second phase, the output signal is approximately equal to the input signal. Consequently, the product of the output voltage and the duration of the second phase remains substantially constant during each cycle.

The invented circuit, therefore, responds to a variable analog input signal by producing an output signal whose waveform has the following characteristics: (i) a constant off-time during which the output voltage is approximately zero volts; (ii) a variable on-time during which the output voltage is approximately equal in amplitude to that of the input signal; and (iii) a substantially constant average output voltage level, independent of variations in the amplitude of the input signal.

Thus, it is a principal object of the present invention to provide a variable duty-cycle and frequency oscillator circuit without utilizing any magnetic components.

It is another principal object of the present invention to provide a variable duty-cycle and frequency oscillator circuit whose average output voltage remains substantially constant despite variations in the amplitude of its input signal.

A still further object of this invention is to implement a variable duty-cycle and frequency oscillator circuit with a minimum of components.

The novel features which are characteristic of the present invention will be better understood from the following detailed description, reference being had to the accompanying drawings in which a presently preferred embodiment of this invention is illustrated by example.

DETAILED DESCRIPTION OF THE INVENTION

Figure 1:
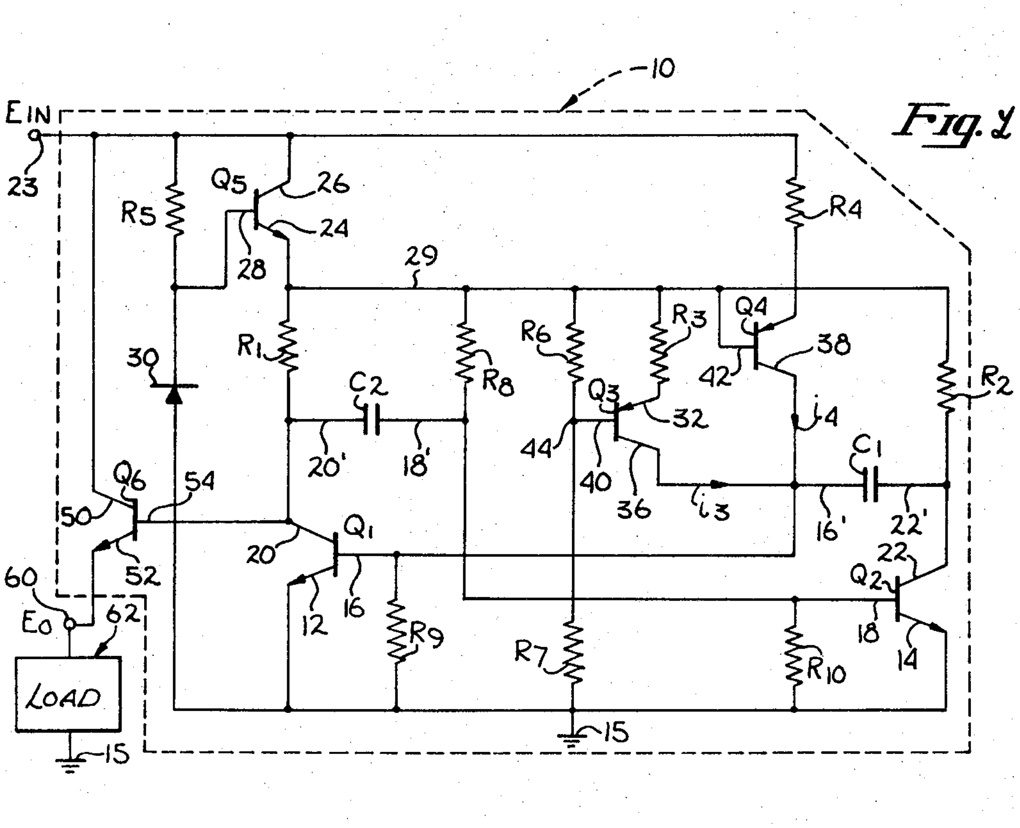
FIG. 1 is a schematic representation of a preferred embodiment of the present invention. In this drawing, capacitive components are designated by the symbol C, inductive components by L, resistive components by R, and transistors by Q. The subscript uniquely identifies the particular component.

With reference to FIG. 1, a preferred embodiment 10 of the present invention will now be described in detail. (Throughout the following description, all references to "connections" shall be understood to mean electricl connections.) Transistor $Q_1$ and $Q_2$, operating as electronic switches, have emitter legs 12 and 14, base legs 16 and 18, and collector legs 20 and 22, respectively. The emitter legs 12 and 14 of transistors $Q_1$ and $Q_2$, respectively, are connected to a circuit ground point 15. The base leg 16 of transistor $Q_1$ is connected to a first side 16' of charging capacitor $C_1$, and the base leg 18 of transistor $Q_2$ is connected to a first side 18 of charging capacitor $C_2$. Similarly, collector leg 20 of transistor $Q_1$ is connected to a second side 20' of capacitor $C_2$, and collector leg 22 of transistor $Q_2$ is connected to a second side 22' of capacitor $C_1$. In addition, collector legs 20 and 22 are connected to a DC voltage source of $V_1$ volts at source point 29 through resistors $R_1$ and $R_2$, respectively. In this preferred embodiment, the DC voltage source at point 29 is derived from an input signal, $E_{in}$, by use of components included within the circuit as disclosed hereinbelow. It should be understood, however, that this invention also contemplates the use of independent conventional DC power supplies. Since the present invention is adapted to receive and respond to analog input signals, the input signal, if it has a sufficient DC component, may be suitable for deriving the circuit's DC voltage source. This is typically the case when the input signal, $E_{in}$, is an unregulated DC voltage which is to be regulated by the invented circuit. However, nothing precludes the use of a conventional DC power supply to provide power to the present invention independent of its input signal, $E_{in}$.

The voltage $V_1$ at source point 29 is a substantially constant voltage, being equal to the voltage across a zener diode 30 less the base-to-emitter voltage of a transistor $Q_5$, $V_{BE_5}$. Transistor $Q_5$ has an emitter leg 24, a collector leg 26 and a base leg 28. The collector leg 26 of transistor $Q_5$ is connected to an input point 23 to which the analog input signal, $E_{in}$, is connected; the emitter leg 24 is connected through resistor $R_1$ to side 20' of capacitor $C_2$; and the base leg 28 is connected to the positive side of zener diode 30, the latter maintaining a constant bias voltage on transistor $Q_5$, causing it to be continuously in a fully conducting state. Zener diode 30 is energized by input signal voltage $E_{in}$ through a resistor $R_5$. As indicated above, voltage $V_1$ could be provided by an independent DC power supply connected to point 29, thereby rendering components $R_5$, $Q_5$ and zener diode 30 unnecessary.

Transistors $Q_3$ and $Q_4$ are utilized as current sources for the charging of capacitor $C_1$. Transistors $Q_3$ and $Q_4$ have emitter legs 32 and 34, collector legs 36 and 38, and base legs 40 and 42, respectively. The emitter leg 32 of transistor $Q_3$ is connected to the DC voltage source point 29 through resistor $R_3$; the collector leg 36 to side 16' of capacitor $C_1$; and the base leg 40 to a point 44, which is the junction point between divider resistors $R_6$ and $R_7$, serially connected between voltage source point 29 and circuit ground 15. Resistors $R_6$ and $R_7$ divide voltage $V_1$ by the ratio of $$R_7/R_6+R_7$$

to produce a voltage $V_2$ at point 44. Voltage $V_2$ is sufficient to bias transistor $Q_3$ into a continuously conducting state. The current $i_3$, flowing through transistor $Q_3$ to capacitor $C_1$ whenever transistor switch $Q_2$ is in its conducting state, is calculable as follows:

$$i_3R_3 = \text{the voltage across resistor } R_3 \tag{i}$$

$$i_3R_3 = V_1 - (V_2 + V_{BE3}), \tag{ii}$$

where $V_{BE3}$ is the base-to-emitter voltage of transistor $Q_3$ $$i_3 = \frac{V_1 - V_2 - V_{BE3}}{R_3} \tag{iii}$$

Since $V_1$, $V_2$, $V_{BE3}$ and $R_3$ are substantially constant, $i_3$ is a substantially constant current.

With reference to transistor $Q_4$, emitter leg 34 is connected through a resistor $R_4$ to the input point 23; the collector leg 38 to side 16' of capacitor $C_1$ and the base leg 42 to voltage source point 29. Voltage $V_1$ is sufficient to maintain transistor $Q_4$ continuously in a conducting state. The current $i_4$, flowing through transistor $Q_4$ to capacitor $C_1$ whenever transistor switch $Q_2$ is in its conducting state, is calculable as follows:

$$i_4R_4 = \text{the voltage across resistor } R_4 \tag{iv}$$

$$i_4R_4 = E_{in} - (V_1 + V_{BE4}) \tag{v}$$

where $V_{BE4}$ is the base-to-emitter voltage of transistor $Q_4$ $$i_4 = \frac{E_{in} - (V_1 + V_{BE4})}{R_4} \tag{vi}$$

Thus, it can be seen that $i_4$ is directly proportional to the amplitude of the input signal $E_{in}$. As will be explained more fully hereinbelow, the current $i_3+i_4$ charges capacitor $C_1$ during one of two portions of each cycle of operation of the invented circuit 10.

Whereas capacitor $C_1$ is charged by current $i_3+i_4$ whenever transistor switch $Q_2$ is in a conducting state, capacitor $C_2$ is charged from the voltage source point 29 through a charging resistor $R_8$ whenever transistor switch $Q_1$ is in a conducting state. Resistor $R_8$ is connected between the voltage source point 29 and side 18' of capacitor $C_2$. Resistors $R_9$ and $R_{10}$ are the usual base resistors connected between base legs 16 and 18 of transistors $Q_1$ and $Q_2$, respectively, and the circuit ground 15.

A transistor $Q_6$, operating as an output switch has a collector leg 50, an emitter leg 52 and a base leg 54. The collector leg 50 of transistor $Q_6$ is connected to input 23; the base leg 54 to the collector leg 20 of transistor switch $Q_1$; and emitter leg 52 is the output terminal 60 of the invented circuit 10. The collector voltage $E_c$ of transistor switch $Q_1$ is used as a gating signal to the base leg 54 of transistor $Q_6$. Thus, the output 52 of the invented circuit 10 is the input signal $E_{in}$ as gated through transistor $Q_6$ by gating signal $E_c$.

The operation of embodiment 10 of the present invention is now described. The operation is cyclic, each cycle consisting of first and second phases. During the first phase of each cycle, capacitor $C_2$ is charged from the voltage source 29 through a first path defined by charging resistor $R_8$, and transistor switch $Q_1$, the latter being in a fully conducting state. The charging rate is determined by the time constant of the path, to wit: $R_8C_2$. During this phase, the voltage on side 20' of capacitor $C_2$ is the relatively small collector-to-emitter voltage of transistor $Q_1$, $V_{CE_1}$. (For all practical purposes, therefore, side 20' is at zero volts when the transistor switch $Q_1$ is conducting.) Thus, side 18' of capacitor $C_2$ is the side where the charging takes place. At the start of the first phase of each cycle, the voltage on side 18' is $-V_1$. The reason why the initial voltage on side 18' is $-V_1$ will become apparent when the electrical dynamics at the end of the preceding cycle are described hereinbelow. The voltage on side 18' rises exponentially from $-V_1$ toward $+V_1$, the voltage level at the DC voltage source point 29. When the voltage on side 18' of capacitor $C_2$ reaches the base-to-emitter voltage of transistor switch $Q_2$, $V_{BE_2}$, the latter is biased to its fully conducting state; whereas, prior to side 18' reaching $V_{BE_2}$ volts, transistor switch $Q_2$ is negatively biased to a non-conducting state. While capacitor $C_2$ is charging, capacitor $C_1$ reaches a quiescent state where side 22' is at $V_1$ volts and side 16' is at the base-to-emitter voltage of transistor $Q_1$, $V_{BE_1}$.

At the instant the voltage on the side 18' of capacitor $C_2$ reaches $V_{BE_2}$, the transistor switch $Q_2$ is turned on, causing the voltage on side 22' of capacitor $C_1$ to instantly drop to the relatively small collector-emitter voltage of transistor $Q_2$ in its conducting state. Since the voltage on capacitor $C_1$ cannot change instantaneously, the voltage on side 16' must drop instantly to $-V_1$ volts. This negative voltage biases off transistor switch $Q_1$. Thus, at this instant, the first phase of the cycle ends and the second phase begins.

The duration of the first phase of each cycle is calculable from the following equation:

$$V_{18'} = -V_1 + 2V_1(1 - e^{-t/R_8C_2}) \tag{vii}$$

where $V_{18'}$ is the voltage on side 18' of capacitor $C_2$ as a function of time, $t$.

Equation (vii) is the classical exponential charging function of an RC circuit with the appropriate initial condition included, to wit: at $t=0$, $V_{18'} = -V_1$.

The duration of the first phase, $t_1$, equals the value of $t$ at which $V_{18'}$ equals $V_{BE_2}$. Thus, $$V_{BE_2} = -V_1 + 2V_1(1 - e^{-t_1/R_8C_2}) \tag{viii}$$

$$e^{-t_1/R_8C_2} = 1 - \frac{V_{BE_2} + V_1}{2V_1} \tag{ix}$$

By taking the logarithm of each side of equation (ix);

$$-(t_1/R_8C_2) = \log_e\left(1 - \frac{V_{BE_2} + V_1}{2V_1}\right) \tag{x}$$

$$t_1 = R_8C_2 \log_e\left(\frac{V_{BE_2} + V_1}{2V_1} - 1\right) \tag{ix}$$

Since $R_8C_2$, $V_{BE_2}$, and $V_1$ are substantially constant, the duration of the first phase of each cycle, $t_1$, is a constant determined by selectable parameters of the circuit 10.

During the second phase of each cycle, the side 16' of capacitor $C_1$ is charged from its initial value of $-V_1$ volts toward approximately $+V_1$ volts by current $i_3 + i_4$, flowing through transistor switch $Q_2$, the latter being in a fully conducting state. During this phase, the voltage on side 22' of capacitor $C_1$ is the relatively small collector-to-emitter of transistor $Q_1$, $V_{CE_2}$. (For all practical purposes, therefore, side 22' is at zero volts when transistor switch $Q_2$ is conducting.) The voltage on side 16' rises linearly as a function of charging current $i_3 + i_4$. When the voltage on side 16' reaches the base-to-emitter voltage of transistor switch $Q_1$, $V_{BE_1}$, the latter is biased to its fully conducting state; whereas, prior to side 16' reaching $V_{BE_1}$ volts, transistor switch $Q_1$ is negatively biased to a non-conducting state. While capacitor $C_1$ is charging, capacitor $C_2$ reaches a quiescent state where side 20' is at $V_1$ volts and side 18' is at $V_{BE_2}$ 9 volts. Thus, the operation of the circuit 10 during the second phase of each cycle, with respect to capacitor $C_1$ and transistor switch $Q_2$, is a mirror image of its operation during the first phase, with respect to capacitor $C_2$ and transistor switch $Q_1$, except that capacitor $C_1$ is charged by current $i_3 + i_4$ which is directly proportional to the input signal voltage $E_{in}$; i.e., $$i_3 + i_4 = (V_1 - V_2 - V_{BE_3}/R_3) + (E_{in}/R_4) - (V_1 + V_{BE_4}/R_4) \qquad \text{(xii)}$$

At the instant the voltage on the side 16' of capacitor $C_2$ reaches $V_{BE_1}$, the transistor switch $Q_1$ is turned on, causing the voltage on side 20' of capacitor $C_1$ to instantly drop to the relatively small collector-to-emitter voltage of transistor $Q_1$ in its conducting state. Since the voltage on capacitor $C_2$ cannot charge instantaneously, the voltage on side 18' must drop instantly to $-V_1$ volts; (hence, the reason why $-V_1$ volts is the initial voltage on capacitor $C_2$ at the start of the first phase of each cycle). This negative voltage biases off transistor switch $Q_2$. At this instant, the second phase ends and the next cycle commences.

The duration of the second phase of each cycle is calculable from the following equation:

$$v_{16'} = -V_1 + \frac{1}{C_1}\int_0^t (i_3 + i_4)\,dt \qquad \text{(xiii)}$$

where $v_{16'}$ is the voltage on side 16' of capacitor $C_1$ as a function of time, $t$.

Thus;

$$v_{16'} = -V_1 + \frac{1}{C_1}\left[\frac{V_1 - V_2 - V_{BE_3}}{R_3} - \frac{V_1 + V_{BE_4}}{R_4}\right]t + \frac{1}{R_4C_1}\int_0^t E_{in}\,dt \qquad \text{(xiv)}$$

The duration of the second phase, $t_2$, equals the value of $t$ at which $v_{16'} = V_{BE_1}$. Thus, $$V_{BE_1} = -V_1 + [(V_1 - V_2 - V_{BE_3}/R_3C_1) - (V_1 + V_{BE_4}/R_4C_1)]\, t_2 + (E_{in}t_2/C_1R_4) \qquad \text{(xv)}$$

$$t_2 = \frac{V_1 + V_{BE_1}}{\left[\dfrac{E_{in}}{R_4C_1} + \dfrac{V_1 - V_2 - V_{BE_3}}{R_3C_1} - \dfrac{V_1 + V_{BE_4}}{R_4C_1}\right]} \qquad \text{(xvi)}$$

Since $V_{BE} \cong 0$;
$V_{BE} \cong 0$; and
$V_{BE} \cong 0$;

$$t_2 \cong \frac{V_1}{\dfrac{E_{in}}{R_4C_1} + \dfrac{V_1 - V_2}{R_3C_1} - \dfrac{V_1}{R_4C_1}} \qquad \text{(xvii)}$$

By making $R_3$ [= $R_4$, $$t_2 \cong (V_1R_4C_1/E_{in} + V_1 - V_2 - V_1) = (V_1R_4C_1/E_{in}V_2); \qquad \text{(xviii)}$$

or $$E_{in}t_2 \cong (V_1R_4C_1/V_2) \cong \text{Constant} \qquad \text{(xix)}$$

Thus, $E_{in}t_2$ is approximately a constant value determined by selectable parameters of the circuit 10.

Gating signal $E_c$, taken from the collector 20 of transistor $Q_1$, has a waveform described as follows: For the fixed duration of $t_1$ (referred to as the "off-time"), $E_c$ is approximately zero volts, a level insufficient to turn on transistor gate $Q_6$. Following the duration of the off-time, $E_c$ steps up to $V_1$ volts and remains there for the duration of $t_2$ (referred to as the "on-time"), $V_1$ being sufficient to bias the transistor gate $Q_6$ to a conducting state. Thus, for the duration of the on-time, the output $E_o$ at terminal 60 equals the input signal $E_{in}$. It should be recognized that the off-time and on-time of the gating signal $E_c$ and, therefore, of the output $E_o$ are the same as the first and second phases of each cycle described above. A load 62 is connected between the output terminal 60 and circuit ground 15.

Figure 2:
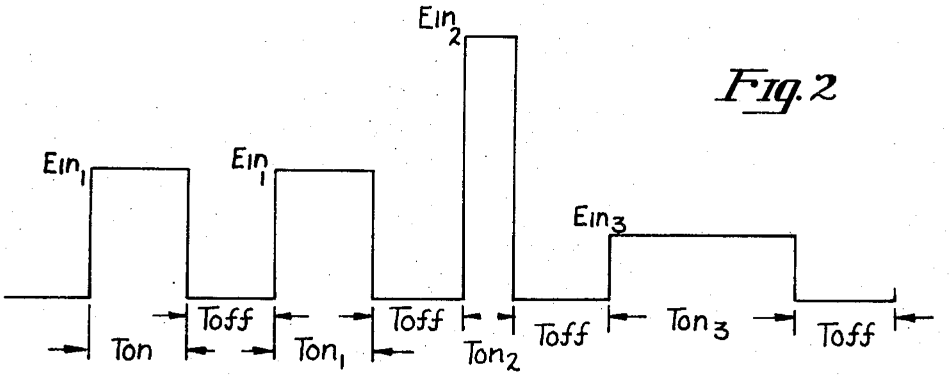
FIG. 2 is a representation of the output voltage waveform of the circuit of FIG. 1.

The waveform of the output $E_o$ at terminal 60 is shown in FIG. 2. The off-time is designated $t_{off}$ and is a fixed interval. During $t_{off}$, $E_o$ is typically zero volts, except when load 62 provides no DC path to ground point 15. The on-time is designated $t_{on}$ and is a variable function of the amplitude of $E_{in}$. When $E_{in} = E_{in_1}$, $t_{on} = t_{on_1}$ so as to yield an area under the voltage-time waveform equal to $E_{in_1} \times t_{on_1}$. Similarly, when $E_{in}$ equals $E_{in_2}$ and $E_{in_3}$ during other cycles, the on-time of the respective cycles are $t_{on_2}$ and $t_{on_3}$ where:

$$E_{in_2} \times t_{on_2} = E_{in_3} \times t_{on_3} = E_{in_1} \times t_{on_1} = \text{Constant} \qquad \text{(xx)}$$

Thus, it can be seen that the invented circuit 10 responds to the variable analog input signal $E_{in}$ by producing an output signal $E_o$ having a substantially constant average amplitude, independent of variations in the amplitude of the input signal $E_o$.

Figure 3:
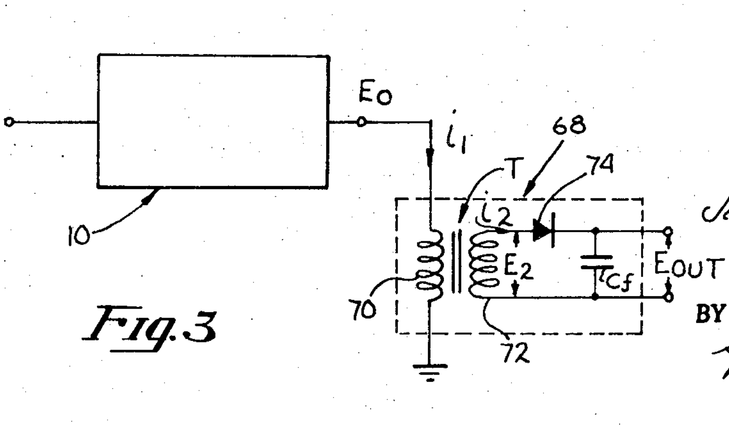
FIG. 3 is a schematic representation of an application wherein the present invention is utilized as a voltage regulator.

One highly advantageous application of the present invention is as a switching regulator in, for example, computer power supplies wherein it provides essentially infinite line compensation. Such an application is schematically shown in FIG. 3. Preferred embodiment 10 is utilized in combination with a filter 68 comprising (i) a coupling transformer T, having primary and secondary windings 70 and 72, respectively; (ii) a power diode 74; and filter capacitor $C_f$, where diode 74 and capacitor $C_f$ are serially connected to secondary 72.

The input to the primary winding 70 of transformer T is the output $E_o$ of circuit 10 whose waveform is shown in FIG. 2. Therefore, the energy into the filter 68 during each cycle is the product of $E_{in}$, $t_{on}$ and $i_1$, where $i_1$ is the current flowing through the primary winding 70 of transformer T. Thus;

$$\text{Energy In} = E_{in} \times t_{on} \times i_1 \quad \text{(xxi)}$$

During the off-time of each cycle, substantially all of the energy stored in the primary winding 70 is transferred to the secondary 72 as the magnetic field collapses in the primary winding 70. Thus, the energy transferred to capacitor $C_f$ is approximately equal to the energy into the primary winding 70, disregarding small losses in transformer T and in diode 74. The energy into capacitor $C_f$ is the product of $E_2$, $t_{off}$ and $i_2$, where $E_2$ is the voltage induced across the secondary winding 72, and $i_2$ is the current flowing through the secondary winding 72 to capacitor $C_f$. Thus;

$$\text{Energy into } C_f = E_2 \times i_2 \times t_{off} \cong \text{Energy In} \quad \text{(xxii)}$$

Since $$\text{Energy} = E_{in} \times t_{on} \times i_i,$$
$$E_2 \times i_2 \times t_{off} \cong E_{in} \times t_{on} \times i_1 \quad \text{(xxiii)}$$

It is a well-known characteristic of transformers that the primary current and the secondary current are related to their respective turns by the following equation:

$$i_1 N_i = i_2 N_2 \quad \text{(xxiv)}$$

where $N_1$ and $N_2$ are the number of turns of primary winding 70 and secondary winding 72 respectively. Thus;

$$E_2 = (E_{in} \times t_{on}/t_{off})\ (N_2/N_1) \quad \text{(xxv)}$$

The voltage across the capacitor $C_f$, $E_{out}$, is equal to $E_2$ less the small voltage drop across the diode 74. Thus;

$$E_{out} \cong E_2 = k\ (E_{in} \times t_{on}/t_{off}), \quad \text{(xxvi)}$$

where $k$ equals the constant turns ratio $N_2/N_1$.

Since it is the essential characteristic of circuit 10 to produce a constant $E_{in} \times t_{on}$ product during each cycle, and since $t_{off}$ is a constant determined by the selection of values of $C_2$ and $R_8$ in circuit 10, it is readily seen that $E_{out}$ will remain constant, independent of variation of the input voltage $E_{in}$; of course, this is precisely the function required of a switching regulator in computer or other power supplies.

Although this invention has been disclosed and described with reference to a particular embodiment, the principles involved are susceptible of other applications which will be apparent to persons skilled in the art. This invention, therefore, is not intended to be limited to the particular embodiment herein disclosed.

I claim:

1. A variable duty-cycle and frequency oscillator circuit, adapted to receive an input signal at an input terminal and having an output terminal comprising:

a. a DC electrical power source derived from said input signal by means of a power transistor having base, emitter and collector legs, said collector leg thereof being electrically coupled to said input terminal, said base leg thereof being electrically connected to a zener diode which is electrically coupled to said input terminal, and said emitter leg thereof being connected to an output point of said DC power source, whereby said power transistor is continually biased to a conducting state by said zener diode and said voltage on said output point is substantially constant;

b. first and second transistors for switching, each of said transistors having base, collector and emitter legs, said collector legs of each being electrically coupled to said output point of said DC power source, said emitter legs of each being electrically connected to a circuit ground;

c. first and second capacitors, each having first and second sides, said first and second sides of said first capacitor being electrically coupled to said base leg of said first switching transistor and said collector leg of said second switching transistor, respectively, and said first and second sides of said second capacitor being electrically coupled to said base leg of said second switching transistor and said collector leg of said first switching transistor, respectively;

d. a source of current electrically coupled to said first side of said first capacitor, said current source comprising:

i. a third transistor having base, collector and emitter legs, said emitter leg thereof being electrically coupled to said input terminal, said base leg thereof being electrically coupled to said output point of said DC power source and said collector leg thereof being electrically coupled to said first side of said first capacitor;

ii. a pair of resistors serially disposed between said output point of said DC power source and said circuit ground, said resistors dividing the voltage of said DC power source; and iii. a fourth transistor having base, collector and emitter legs, said emitter leg thereof being electrically coupled to said output point of said DC power source, said base leg thereof being electrically coupled to a junction of said pair of resistors, and said collector leg thereof being electrically coupled to said first side of said first capacitor, whereby said third and fourth transistors are continually in a conducting state, said third transistor providing a collector current which is directly proportional to the amplitude of said input signal, and said fourth transistor providing a substantially constant collector current.

e. a resistor electrically coupling said first side of said second capacitor to said DC power source; and f. a fifth transistor for switching, said fifth transistor having base, collector and emitter legs, said collector leg thereof being electrically coupled to said input terminal, said emitter leg thereof being electrically coupled to said output terminal, and said base leg thereof being electrically coupled to said collector leg of said first transistor, whereby said first and second transistors each cyclically and alternately switching between conducting and non-conducting states, said first transistor being in a conducting state and said second transistor being in a non-conducting state for a fixed time interval during each cycle of operation of said circuit, said fixed time interval being the time required for said first side of said second capacitor to be charged by said DC power source to a bias voltage which causes said second transistor to conduct, and said second transistor being in a conducting state and said first transistor being in a non-conducting state for a variable time interval during each cycle of said operation, said variable time interval being the time required for said first side of said first capacitor to be charged by said current source to a bias voltage which causes said first transistor to conduct, said variable time interval being inversely proportional to the amplitude of said input signal, said cyclic switching of said first transistor causing said fifth transistor to be in a conducting state for said variable time interval and in a non-conducting state for said fixed interval, said input signal thereby appearing at said output terminal for said variable time interval of each cycle.

* * * * *